United States Patent
Suzuki et al.

(10) Patent No.: US 12,074,511 B2
(45) Date of Patent: Aug. 27, 2024

(54) DIRECT CURRENT POWER SUPPLY DEVICE AND AIR CONDITIONER

(71) Applicant: Mitsubishi Electric Corporation, Tokyo (JP)

(72) Inventors: Hiroki Suzuki, Tokyo (JP); Keiichiro Shizu, Tokyo (JP); Tomohiro Kutsuki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 233 days.

(21) Appl. No.: 17/627,367

(22) PCT Filed: Nov. 6, 2019

(86) PCT No.: PCT/JP2019/043548
§ 371 (c)(1),
(2) Date: Jan. 14, 2022

(87) PCT Pub. No.: WO2021/090416
PCT Pub. Date: May 14, 2021

(65) Prior Publication Data
US 2022/0271647 A1    Aug. 25, 2022

(51) Int. Cl.
*H02M 3/158*    (2006.01)
*F25B 49/02*    (2006.01)
(Continued)

(52) U.S. Cl.
CPC ............ *H02M 1/32* (2013.01); *F25B 49/022* (2013.01); *H02M 7/06* (2013.01); *H02P 27/06* (2013.01);
(Continued)

(58) Field of Classification Search
CPC .......... H02P 27/06; H05K 7/209; H02M 7/06; H02M 7/003; H02M 3/158; H02M 1/32;
(Continued)

(56) References Cited

U.S. PATENT DOCUMENTS 5,872,445 A * 2/1999 Ozawa ................. H02J 7/0068
320/DIG. 12
2016/0248352 A1   8/2016 Shinomoto et al.
(Continued)

FOREIGN PATENT DOCUMENTS

| JP | 2003-174780 A | 6/2003 |
| WO | 2015/056340 A1 | 4/2015 |
| WO | 2015/125240 A1 | 8/2015 |

OTHER PUBLICATIONS

International Search Report of the International Searching Authority dated Jan. 28, 2020, issued in corresponding International Application No. PCT/JP2019/043548 (and English Machine Translation).

*Primary Examiner* — Gabriel Agared
(74) *Attorney, Agent, or Firm* — POSZ LAW GROUP, PLC

(57) ABSTRACT

A direct current power supply device includes a rectifier circuit that rectifies alternating current power supplied from an alternating current power supply and converts the alternating current power into direct current power, a charge storage unit that includes a function of storing a charge, a charger that charges the charge storage unit, and a heat sink. The charger includes a positive-side switching element, a negative-side switching element, a positive-side backflow prevention diode, and a negative-side backflow prevention diode. The positive-side switching element, the negative-side switching element, the positive-side backflow prevention diode, and the negative-side backflow prevention diode are discrete semiconductor elements. The negative-side backflow prevention diode is a full mold package element. The positive-side switching element, the negative-side switching element, and the positive-side backflow prevention diode are elements that are not full mold packages.

15 Claims, 16 Drawing Sheets

(51) Int. Cl.
- *H02M 1/32* (2007.01)
- *H02M 7/06* (2006.01)
- *H02P 27/06* (2006.01)
- *H05K 7/20* (2006.01)

(52) U.S. Cl.
CPC ........ *H05K 7/209* (2013.01); *F25B 2600/021* (2013.01)

(58) Field of Classification Search
CPC .. H02M 1/327; F25B 49/022; F25B 2600/021
USPC .......................................... 318/504
See application file for complete search history.

(56) References Cited

U.S. PATENT DOCUMENTS

| | | | |
|---|---|---|---|
| 2016/0294312 A1* | 10/2016 | Tsumura | H02M 5/458 |
| 2016/0380575 A1* | 12/2016 | Tsumura | H02P 6/14 |
| | | | 318/478 |
| 2017/0016655 A1 | 1/2017 | Shinomoto et al. | |
| 2017/0201186 A1* | 7/2017 | Yuasa | H02M 1/14 |
| 2018/0358906 A1* | 12/2018 | Hatakeyama | H02J 7/00 |
| 2019/0206810 A1* | 7/2019 | Kanai | H01L 23/60 |
| 2020/0220482 A1* | 7/2020 | Tanabe | H02M 1/4233 |

* cited by examiner

DIRECT CURRENT POWER SUPPLY DEVICE AND AIR CONDITIONER

CROSS REFERENCE TO RELATED APPLICATION

This application is a U.S. national stage application of International Patent Application No. PCT/JP2019/043548 filed on Nov. 6, 2019, the disclosure of which is incorporated herein by reference.

TECHNICAL FIELD

The present invention relates to a direct current power supply device and an air conditioner including the direct current power supply device.

BACKGROUND

Conventional air conditioners, refrigerators, freezers, and heat pump water heaters are equipped with a direct current power supply device that converts alternating current power into direct current power. A load including an inverter that drives a motor of a compressor is connected to the direct current power supply device. For example, Patent Literature 1 discloses a technique in which a direct current power supply device that converts alternating current power supplied from an alternating current power supply into direct current power and supplies the direct current power to a load detects a voltage between both ends of a positive-side capacitor and a negative-side capacitor connected in series between two output terminals of the direct current power to the load, and detects a failure of a switching element on the basis of a potential difference of the voltage between the both ends.

PATENT LITERATURE

Patent Literature 1: International Publication No. WO 2015/056340

According to the conventional technique, it is possible to prevent a short circuit of the positive-side capacitor and the negative-side capacitor by detecting a failure due to a short circuit of the switching element in the direct current power supply device and stopping the switching operation of the switching element. However, in a case where a discrete semiconductor is used for the switching element and a backflow prevention diode, and the discrete semiconductor is cooled by being bonded to a heat sink, a path is generated in which the power supply is short-circuited via the heat sink when the discrete semiconductor and the heat sink are not electrically insulated. As a result, there is a problem of an inrush current that occurs regardless of whether or not the switching operation is performed, and thus occurrence of breakdown of the element and heat loss of a circuit.

SUMMARY

The present invention has been made in view of the above, and an object of the present invention is to provide a direct current power supply device that avoids a state in which a power supply is short-circuited via a heat sink, and prevents breakdown of an element and heat loss of a circuit due to an inrush current.

In order to solve the above problem and achieve the object, a direct current power supply device according to the present invention is a direct current power supply device that converts alternating current power supplied from an alternating current power supply into direct current power and supplies the direct current power to a load, the direct current power supply device including: a rectifier circuit that rectifies the alternating current power supplied from the alternating current power supply and converts the alternating current power into the direct current power; a first output terminal and a second output terminal that are terminals for outputting the direct current power from the direct current power supply device to the load; a charge storage unit connected to the first output terminal and the second output terminal and including a function of storing a charge; a charger that charges the charge storage unit on the basis of the direct current power obtained by the rectifier circuit; and a heat sink. The charge storage unit includes a positive-side capacitor and a negative-side capacitor connected in series. The charger includes a positive-side switching element, a negative-side switching element, a positive-side backflow prevention diode, and a negative-side backflow prevention diode for charging one or both of the positive-side capacitor and the negative-side capacitor. The positive-side switching element, the negative-side switching element, the positive-side backflow prevention diode, and the negative-side backflow prevention diode are discrete semiconductor elements. The heat sink includes a function of dissipating heat of the positive-side switching element, the negative-side switching element, the positive-side backflow prevention diode, and the negative-side backflow prevention diode. The positive-side switching element, the negative-side switching element, the positive-side backflow prevention diode, and the negative-side backflow prevention diode are disposed on one or a plurality of planes of the heat sink. The negative-side backflow prevention diode is a full mold package element. The positive-side switching element, the negative-side switching element, and the positive-side backflow prevention diode are elements that are not full mold packages.

The direct current power supply device according to the present invention has an effect of being able to avoid a state in which the power supply is short-circuited via the heat sink, and prevent breakdown of the element and heat loss of the circuit due to an inrush current.

DETAILED DESCRIPTION

A direct current power supply device and an air conditioner according to embodiments of the present invention will now be described in detail with reference to the drawings. Note that the present invention is not limited to the embodiments.

First Embodiment

Figure 1:
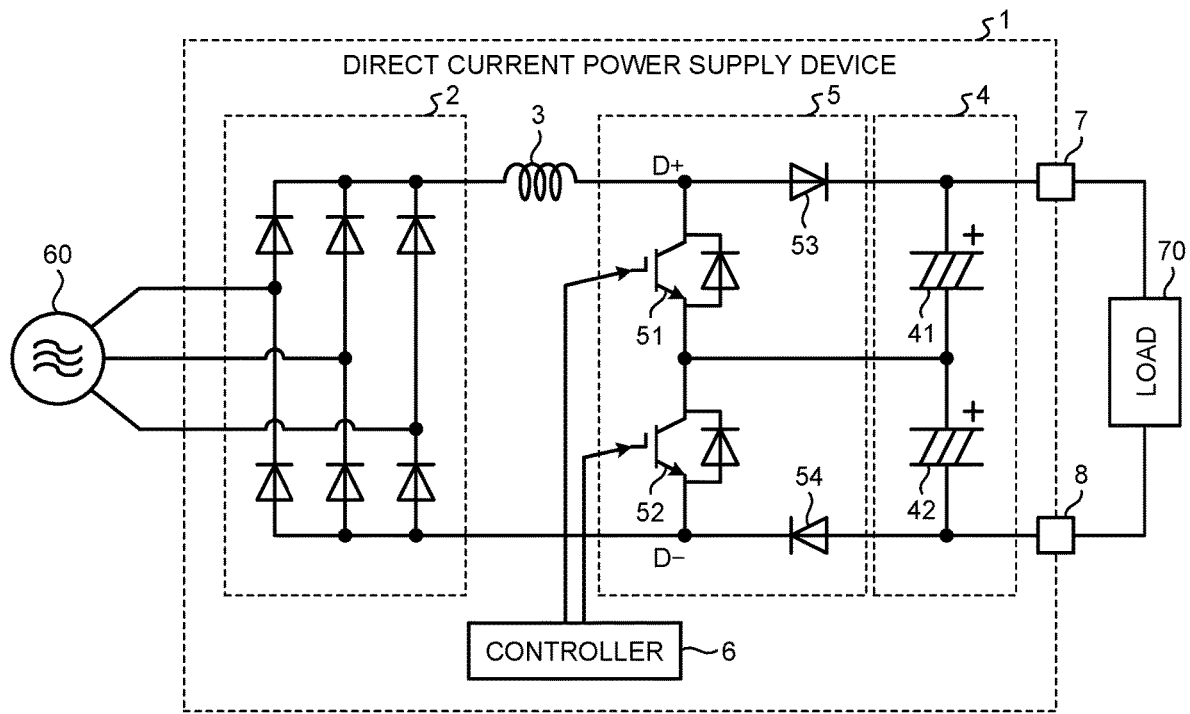
FIG. 1 is a diagram illustrating a configuration of a direct current power supply device according to a first embodiment.

FIG. 1 is a diagram illustrating a configuration of a direct current power supply device 1 according to a first embodiment. The direct current power supply device 1 is a converter that converts alternating current power supplied from an alternating current power supply 60 into direct current power, and supplies the direct current power obtained by the conversion to a load 70. FIG. 1 also illustrates the alternating current power supply 60 and the load 70. The alternating current power supply 60 is illustrated as a three-phase alternating current power supply in FIG. 1, but may be a single-phase alternating current power supply. For example, the load 70 includes an inverter that drives a motor of a compressor included in an air conditioner.

The direct current power supply device 1 includes a rectifier circuit 2 that rectifies the alternating current power supplied from the alternating current power supply 60 and converts the alternating current power into the direct current power, a reactor 3 connected to an output side of the rectifier circuit 2, and a charge storage unit 4 including a function of storing charges. The direct current power supply device 1 further includes a charger 5 for charging the charge storage unit 4 on the basis of the direct current power obtained by the rectifier circuit 2, and a controller 6 that controls the charger 5. The direct current power supply device 1 further includes a first output terminal 7 and a second output terminal 8 that are terminals for outputting the direct current power from the direct current power supply device 1 to the load 70.

The charge storage unit 4 is connected to the first output terminal 7 and the second output terminal 8. The charge storage unit 4 includes a positive-side capacitor 41 and a negative-side capacitor 42 connected in series. Between two ends of the positive-side capacitor 41, the end not connected to the negative-side capacitor 42 is connected to the first output terminal 7, and between two ends of the negative-side capacitor 42, the end not connected to the positive-side capacitor 41 is connected to the second output terminal 8.

The rectifier circuit 2 is a three-phase full-wave rectifier circuit in which a plurality of rectifier diodes is connected in a full-bridge configuration when the alternating current power supply 60 supplies three-phase alternating current, or is a single-phase full-wave rectifier circuit when the alternating current power supply 60 supplies single-phase alternating current. The reactor 3 may be connected to an input side of the rectifier circuit 2. In any case, the reactor 3 is connected to the rectifier circuit 2.

The charger 5 includes a positive-side switching element 51, a negative-side switching element 52, a positive-side backflow prevention diode 53, and a negative-side backflow prevention diode 54 for charging one or both of the positive-side capacitor 41 and the negative-side capacitor 42 included in the charge storage unit 4. The positive-side switching element 51, the negative-side switching element 52, the positive-side backflow prevention diode 53, and the negative-side backflow prevention diode 54 are discrete semiconductor elements. The positive-side switching element 51, the negative-side switching element 52, and the positive-side backflow prevention diode 53 are elements that are not full mold packages. The negative-side backflow prevention diode 54 is a full mold package element. The element that is not a full mold package is an element sealed in a package that is not fully molded.

The positive-side switching element 51 and the negative-side switching element 52 are, for example, insulated gate bipolar transistors (IGBTs), power metal-oxide-semiconductor field-effect transistors (MOSFETs), or power transistors. The operations of the positive-side switching element 51 and the negative-side switching element 52 are controlled by the controller 6.

When the positive-side switching element 51 is turned on by the control of the controller 6, the negative-side capacitor 42 is charged. When the negative-side switching element 52 is turned on by the control of the controller 6, the positive-side capacitor 41 is charged. The positive-side backflow prevention diode 53 is disposed between a connection point between the reactor 3 and the positive-side switching element 51 and a connection point between the positive-side capacitor 41 and the first output terminal 7 in a state where the direction from a collector or source of the positive-side switching element 51 to the connection point between the positive-side capacitor 41 and the first output terminal 7 corresponds to a forward direction. The positive-side backflow prevention diode 53 prevents backflow of the charge stored in the positive-side capacitor 41.

The negative-side backflow prevention diode 54 is disposed between a connection point between the rectifier circuit 2 and the negative-side switching element 52 and a connection point between the negative-side capacitor 42 and the second output terminal 8 in a state where the direction from the connection point between the negative-side capacitor 42 and the second output terminal 8 to an emitter or drain of the negative-side switching element 52 corresponds to a forward direction. The negative-side backflow prevention diode 54 prevents backflow of the charge stored in the negative-side capacitor 42.

The positive-side backflow prevention diode 53 is connected to the positive-side capacitor 41, and the negative-side backflow prevention diode 54 is connected to the negative-side capacitor 42. In FIG. 1, a connection point between the collector or source of the positive-side switching element 51 and an anode of the positive-side backflow prevention diode 53 is a contact D+. A connection point between the emitter or drain of the negative-side switching element 52 and a cathode of the negative-side backflow prevention diode 54 is a contact D−.

Figure 2:
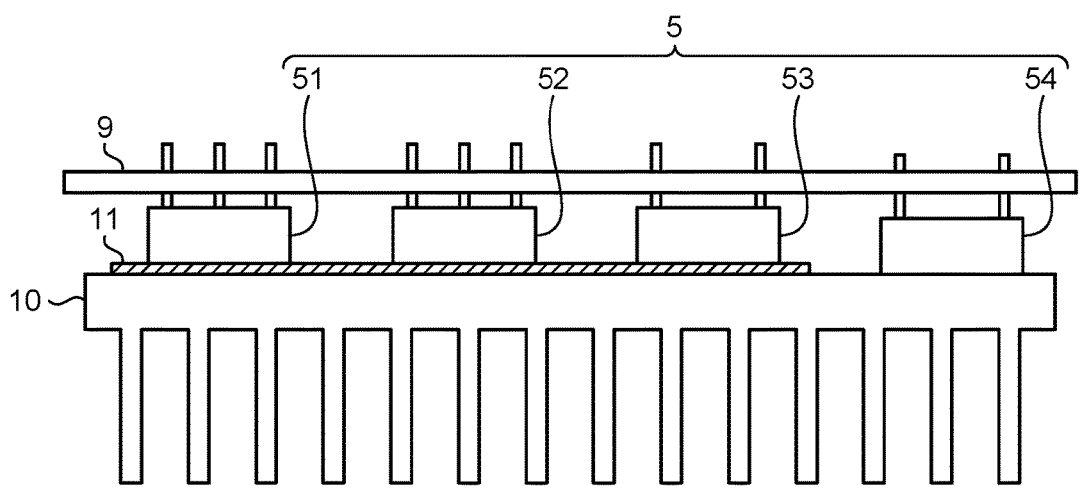
FIG. 2 is a first diagram illustrating a configuration of a charger included in the direct current power supply device according to the first embodiment.
Figure 3:
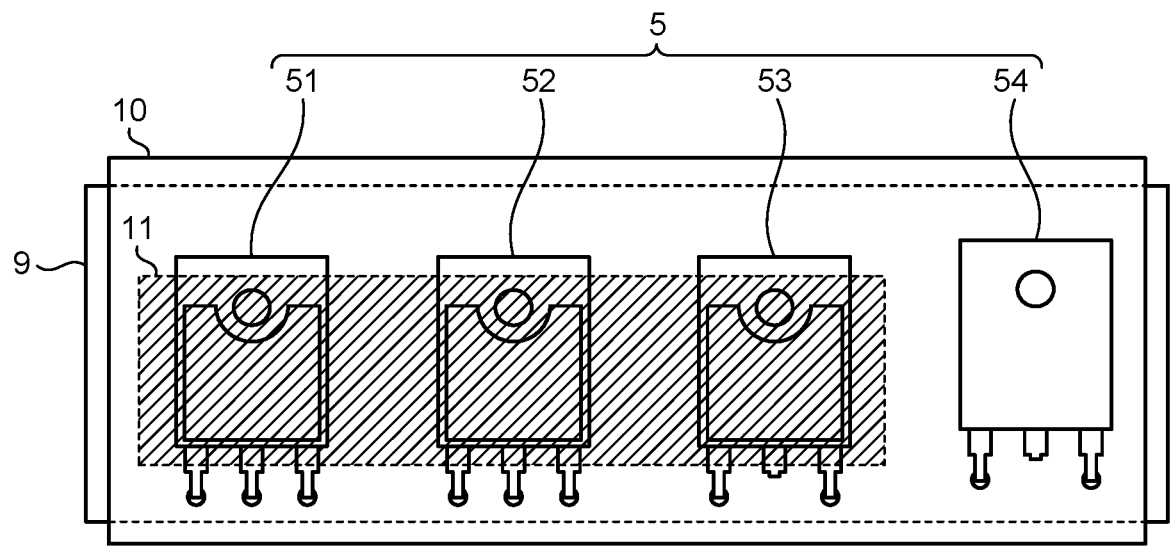
FIG. 3 is a second diagram illustrating a configuration of the charger included in the direct current power supply device according to the first embodiment.
Figure 4:
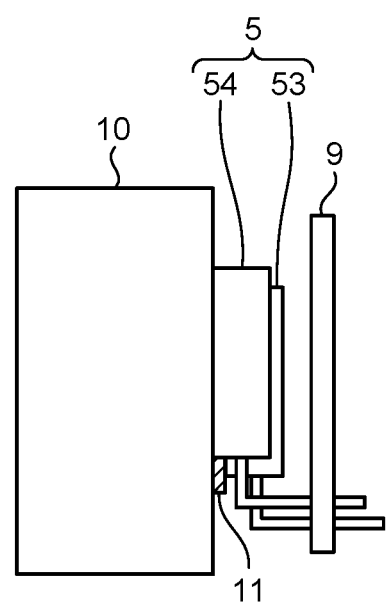
FIG. 4 is a third diagram illustrating a configuration of the charger included in the direct current power supply device according to the first embodiment.

FIG. 2 is a first diagram illustrating a configuration of the charger 5 included in the direct current power supply device 1 according to the first embodiment. FIG. 3 is a second diagram illustrating a configuration of the charger 5 included in the direct current power supply device 1 according to the first embodiment. FIG. 4 is a third diagram illustrating a configuration of the charger 5 included in the direct current power supply device 1 according to the first embodiment. FIG. 2 schematically illustrates a plane surface of the charger 5, FIG. 3 schematically illustrates a front surface of the charger 5, and FIG. 4 schematically illustrates a side surface of the charger 5.

As illustrated in FIGS. 2, 3, and 4, the direct current power supply device 1 further includes a printed circuit board 9 to which the positive-side switching element 51, the negative-side switching element 52, the positive-side backflow prevention diode 53, and the negative-side backflow prevention diode 54 are attached. FIGS. 2, 3, and 4 also illustrate the printed circuit board 9.

The direct current power supply device 1 further includes a heat sink 10 having a function of dissipating heat of the positive-side switching element 51, the negative-side switching element 52, the positive-side backflow prevention diode 53, and the negative-side backflow prevention diode 54. That is, the heat sink 10 has a function of cooling the positive-side switching element 51, the negative-side switching element 52, the positive-side backflow prevention diode 53, and the negative-side backflow prevention diode 54. The heat sink 10 is made of metal. FIGS. 2, 3, and 4 also illustrate the heat sink 10. The positive-side switching element 51, the negative-side switching element 52, the positive-side backflow prevention diode 53, and the negative-side backflow prevention diode 54 are disposed on one plane of the heat sink 10. The positive-side switching element 51, the negative-side switching element 52, the positive-side backflow prevention diode 53, and the negative-side backflow prevention diode 54 are thermally coupled to the heat sink 10.

As illustrated in FIG. 2, the direct current power supply device 1 further includes an insulating sheet 11 positioned between the heat sink 10 and each of the positive-side switching element 51, the negative-side switching element 52, and the positive-side backflow prevention diode 53. The insulating sheet 11 electrically insulates each of the positive-side switching element 51, the negative-side switching element 52, and the positive-side backflow prevention diode 53. FIGS. 2, 3, and 4 also illustrate the insulating sheet 11.

Figure 5:
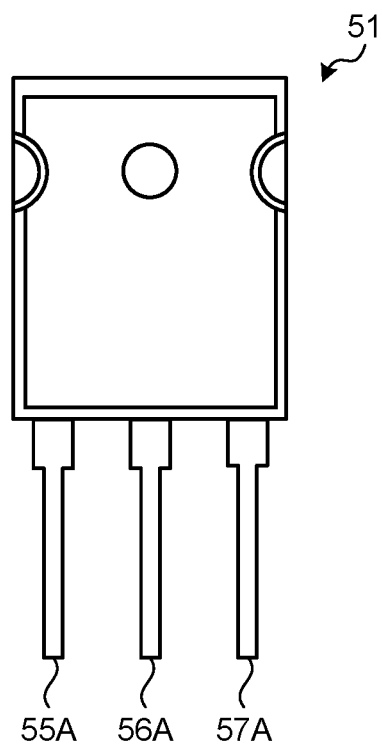
FIG. 5 is a first diagram illustrating a configuration of a positive-side switching element included in the charger of the direct current power supply device according to the first embodiment.
Figure 6:
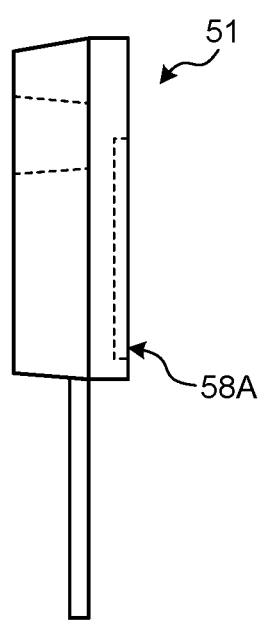
FIG. 6 is a second diagram illustrating a configuration of the positive-side switching element included in the charger of the direct current power supply device according to the first embodiment.
Figure 7:
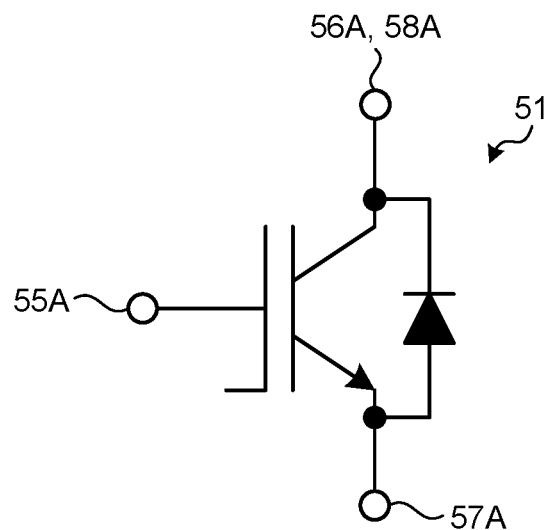
FIG. 7 is a third diagram illustrating a configuration of the positive-side switching element included in the charger of the direct current power supply device according to the first embodiment.

FIG. 5 is a first diagram illustrating a configuration of the positive-side switching element 51 included in the charger 5 of the direct current power supply device 1 according to the first embodiment. FIG. 6 is a second diagram illustrating a configuration of the positive-side switching element 51 included in the charger 5 of the direct current power supply device 1 according to the first embodiment. FIG. 7 is a third diagram illustrating a configuration of the positive-side switching element 51 included in the charger 5 of the direct current power supply device 1 according to the first embodiment. FIG. 5 schematically illustrates a front surface of the positive-side switching element 51, and FIG. 6 schematically illustrates a side surface of the positive-side switching element 51. FIG. 7 is a circuit diagram of the positive-side switching element 51. The positive-side switching element 51 includes a gate 55A, collectors 56A and 58A, and an emitter 57A. The configuration of the negative-side switching element 52 is the same as the configuration of the positive-side switching element 51.

Figure 8:
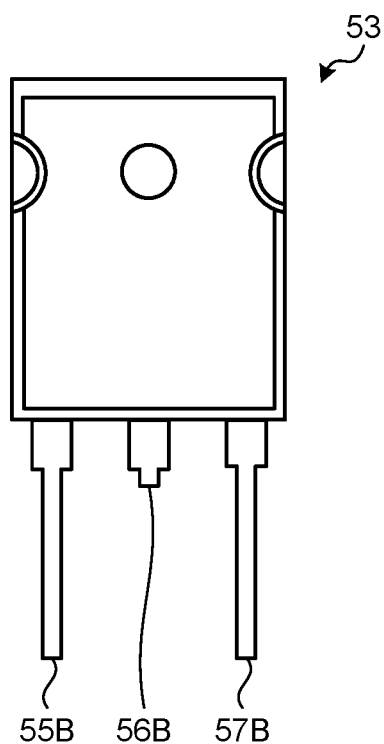
FIG. 8 is a first diagram illustrating a configuration of a positive-side backflow prevention diode included in the charger of the direct current power supply device according to the first embodiment.
Figure 9:
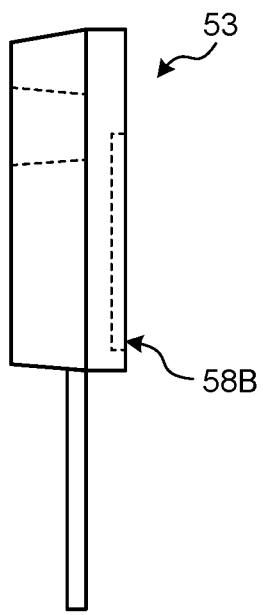
FIG. 9 is a second diagram illustrating a configuration of the positive-side backflow prevention diode included in the charger of the direct current power supply device according to the first embodiment.
Figure 10:
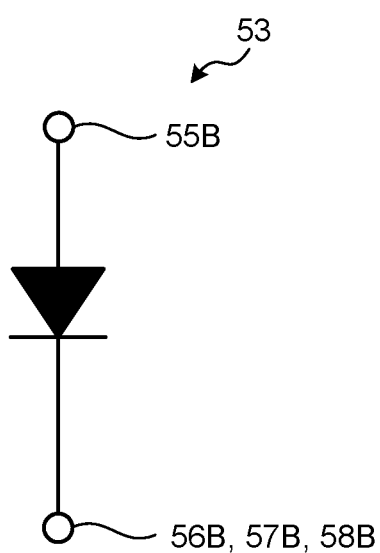
FIG. 10 is a third diagram illustrating a configuration of the positive-side backflow prevention diode included in the charger of the direct current power supply device according to the first embodiment.

FIG. 8 is a first diagram illustrating a configuration of the positive-side backflow prevention diode 53 included in the charger 5 of the direct current power supply device 1 according to the first embodiment. FIG. 9 is a second diagram illustrating a configuration of the positive-side backflow prevention diode 53 included in the charger 5 of the direct current power supply device 1 according to the first embodiment. FIG. 10 is a third diagram illustrating a configuration of the positive-side backflow prevention diode 53 included in the charger 5 of the direct current power supply device 1 according to the first embodiment. FIG. 8 schematically illustrates a front surface of the positive-side backflow prevention diode 53, and FIG. 9 schematically illustrates a side surface of the positive-side backflow prevention diode 53. FIG. 10 is a circuit diagram of the positive-side backflow prevention diode 53. The positive-side backflow prevention diode 53 includes an anode 55B and cathodes 56B, 57B, and 58B. The configuration of the negative-side backflow prevention diode 54 is the same as the configuration of the positive-side backflow prevention diode 53, but since the negative-side backflow prevention diode 54 is the full mold package element, the cathode electrode is not exposed on the component surface.

In the first embodiment, the positive-side switching element 51, the negative-side switching element 52, and the positive-side backflow prevention diode 53 are the elements that are not full mold packages. Therefore, the electrodes are exposed on surfaces of the positive-side switching element 51, the negative-side switching element 52, and the positive-side backflow prevention diode 53 in contact with the heat sink 10. In the positive-side switching element 51 and the negative-side switching element 52, the collector electrodes are exposed. In the positive-side backflow prevention diode 53, the cathode electrode is exposed.

In FIG. 1, the collector or source of each of the positive-side switching element 51 and the negative-side switching element 52 is not electrically connected to the cathode of the positive-side backflow prevention diode 53. Since the positive-side switching element 51, the negative-side switching element 52, and the positive-side backflow prevention diode 53 are the discrete semiconductor elements that are not full mold packages, the positive-side switching element 51, the negative-side switching element 52, and the positive-side backflow prevention diode 53 are electrically short-circuited when in direct contact with the heat sink 10. In order to prevent this, the positive-side switching element 51, the negative-side switching element 52, and the positive-side backflow prevention diode 53 are attached to the heat sink 10 via the insulating sheet 11 having relatively good insulation properties.

In a case where the attachment of the insulating sheet 11 is misaligned, the insulating sheet 11 is not attached, or the insulating sheet 11 is broken, a short circuit occurs between the electrodes exposed on the surfaces of the elements in contact with the heat sink 10. For example, in a case where the collector or source of the positive-side switching element 51 and the cathode of the negative-side backflow prevention diode 54 are short-circuited, the contact D+ and the contact D− are electrically connected to each other so that an inrush current cannot be prevented even when the positive-side switching element 51 is turned off, and an excessive current flows through each element for a relatively long time at the time of power-on, thereby causing breakdown of each element and heat loss of the circuit.

In the first embodiment, among the positive-side switching element 51, the negative-side switching element 52, the positive-side backflow prevention diode 53, and the negative-side backflow prevention diode 54 included in the charger 5, only the negative-side backflow prevention diode 54 is the full mold package element. The direct current power supply device 1 includes the negative-side backflow prevention diode 54 that is the full mold package element, thereby preventing an excessive current from flowing due to electrical connection between the contact D+ and the contact D−.

Figure 11:
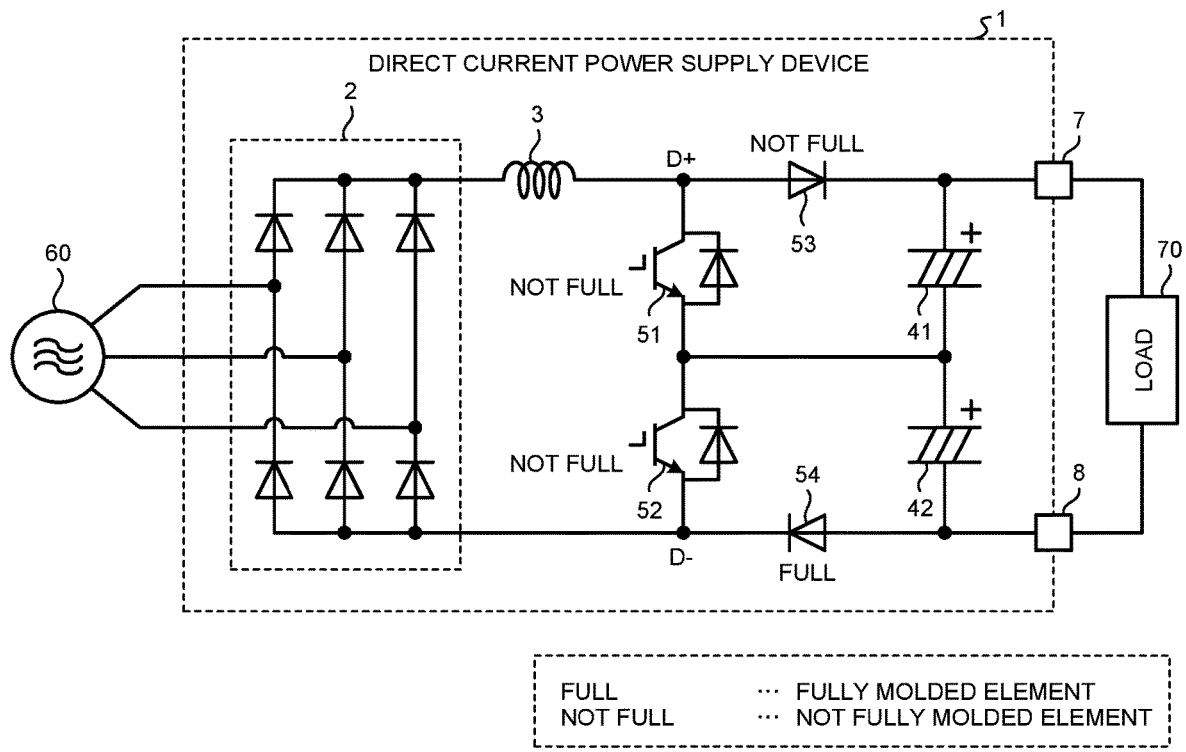
FIG. 11 is a circuit diagram of the direct current power supply device according to the first embodiment in a case where a negative-side backflow prevention diode included in the charger of the direct current power supply device is a full mold package element, and the positive-side switching element, a negative-side switching element, and the positive-side backflow prevention diode included in the charger are elements that are not full mold packages.
Figure 12:
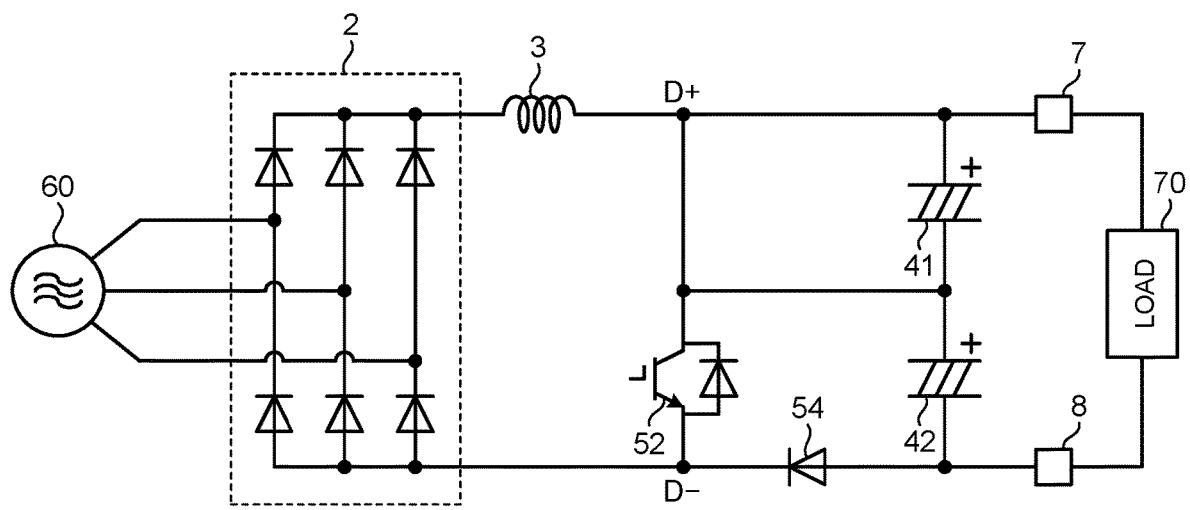
FIG. 12 is a schematic diagram of a circuit when the positive-side switching element, the negative-side switching element, and the positive-side backflow prevention diode in FIG. 11 are short-circuited via a heat sink.

FIG. 11 is a circuit diagram of the direct current power supply device 1 according to the first embodiment in the case where the negative-side backflow prevention diode 54 included in the charger 5 of the direct current power supply device 1 is the full mold package element, and the positive-side switching element 51, the negative-side switching element 52, and the positive-side backflow prevention diode 53 included in the charger 5 are elements that are not full mold packages. FIG. 12 is a schematic diagram of a circuit when the positive-side switching element 51, the negative-side switching element 52, and the positive-side backflow prevention diode 53 in FIG. 11 are short-circuited via the heat sink 10.

As described above, the direct current power supply device 1 includes the negative-side backflow prevention diode 54 that is the full mold package element. Thus, in the direct current power supply device 1, the contact D+ and the contact D− are not electrically connected, and an excessive current does not flow for a relatively long time even at the time of power-on.

Therefore, the direct current power supply device 1 according to the first embodiment can avoid a state in which the power supply is short-circuited via the heat sink 10, and can prevent breakdown of the element and heat loss of the circuit due to an inrush current. In other words, the direct current power supply device 1 can prevent the occurrence of a short circuit at the time of power-on while minimizing the use of a full mold package element having a relatively high cost, and prevent breakdown of the element and heat loss of the circuit while being relatively inexpensive.

Second Embodiment

Figure 13:
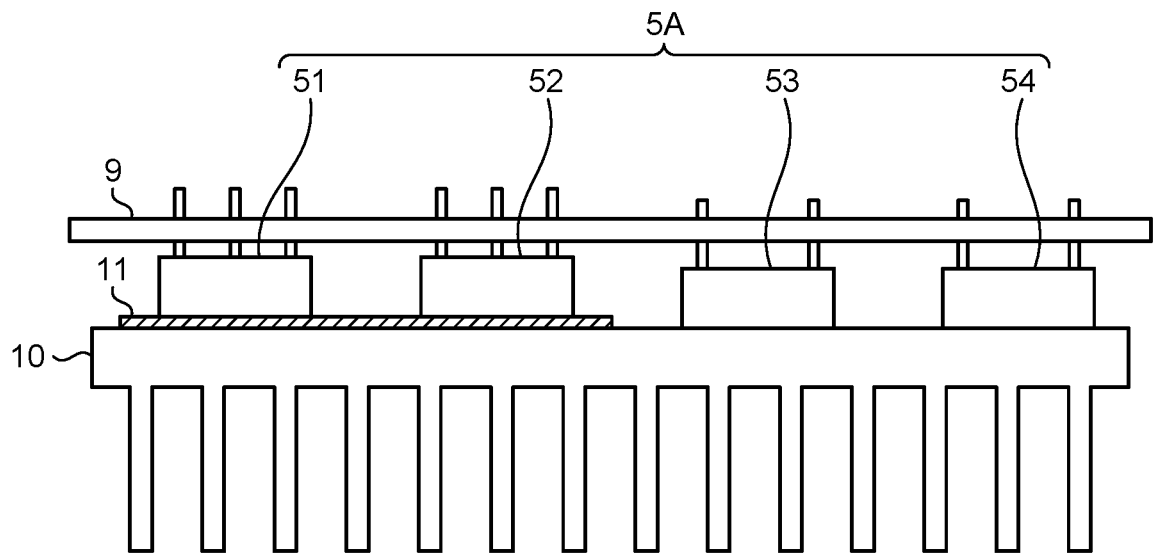
FIG. 13 is a first diagram illustrating a configuration of a charger included in a direct current power supply device according to a second embodiment.
Figure 14:
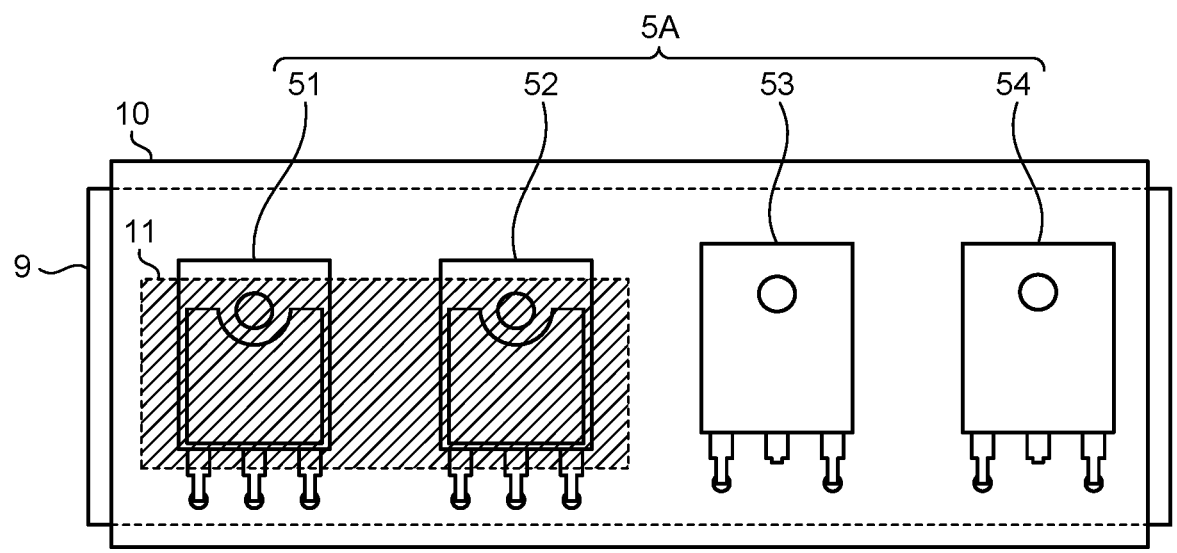
FIG. 14 is a second diagram illustrating a configuration of the charger included in the direct current power supply device according to the second embodiment.
Figure 15:
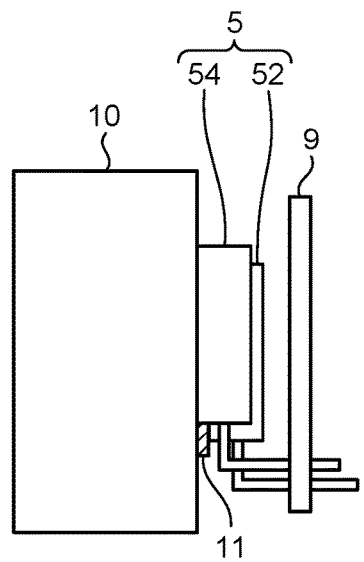
FIG. 15 is a third diagram illustrating a configuration of the charger included in the direct current power supply device according to the second embodiment.

FIG. 13 is a first diagram illustrating a configuration of a charger 5A included in a direct current power supply device according to a second embodiment. FIG. 14 is a second diagram illustrating a configuration of the charger 5A included in the direct current power supply device according to the second embodiment. FIG. 15 is a third diagram illustrating a configuration of the charger 5A included in the direct current power supply device according to the second embodiment. FIG. 13 schematically illustrates a plane surface of the charger 5A, FIG. 14 schematically illustrates a front surface of the charger 5A, and FIG. 15 schematically illustrates a side surface of the charger 5A. The direct current power supply device according to the second embodiment is a device in which the charger 5 included in the direct current power supply device 1 according to the first embodiment is replaced with the charger 5A. The second embodiment mainly describes differences from the first embodiment.

In the second embodiment, among the positive-side switching element 51, the negative-side switching element 52, the positive-side backflow prevention diode 53, and the negative-side backflow prevention diode 54 included in the charger 5A, the positive-side backflow prevention diode 53 and the negative-side backflow prevention diode 54 are full mold package elements. The positive-side switching element 51 and the negative-side switching element 52 are elements that are not full mold packages. In the second embodiment, the insulating sheet 11 is positioned between the heat sink 10 and each of the positive-side switching element 51 and the negative-side switching element 52, thereby electrically insulating the positive-side switching element 51 and the negative-side switching element 52.

Figure 16:
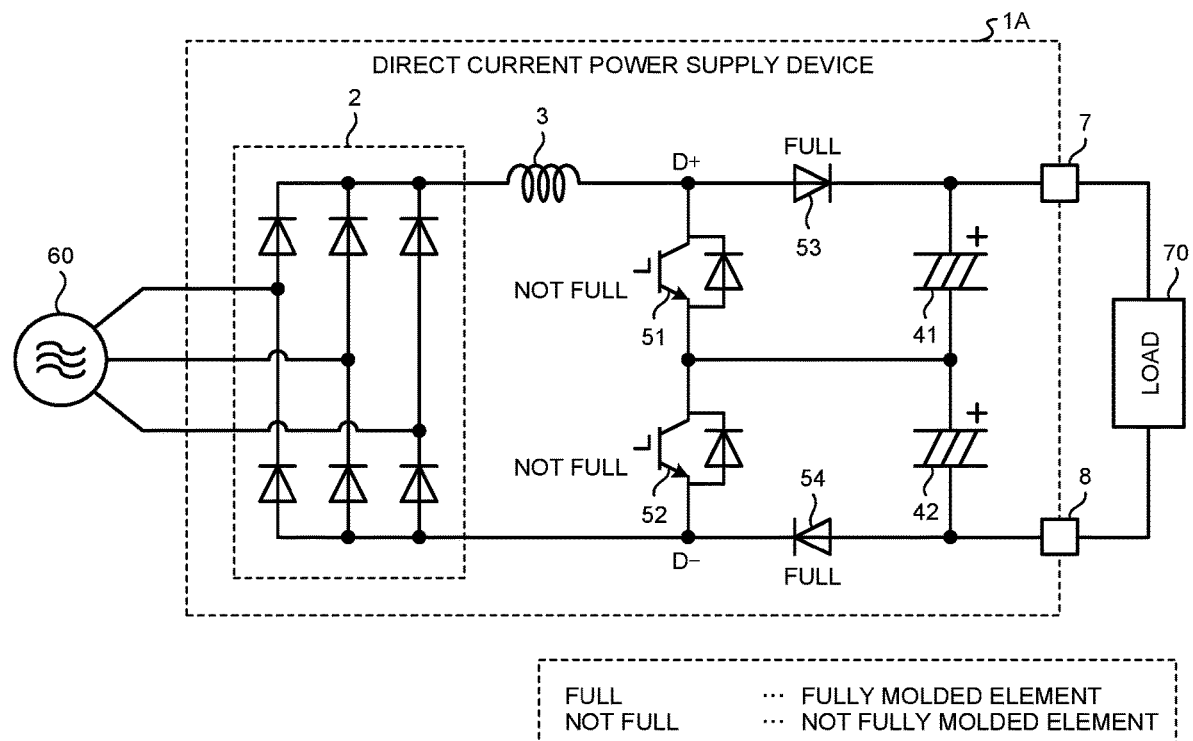
FIG. 16 is a circuit diagram of the direct current power supply device according to the second embodiment in a case where the positive-side backflow prevention diode and the negative-side backflow prevention diode included in the charger of the direct current power supply device are full mold package elements, and the positive-side switching element and the negative-side switching element included in the charger are elements that are not full mold packages.
Figure 17:
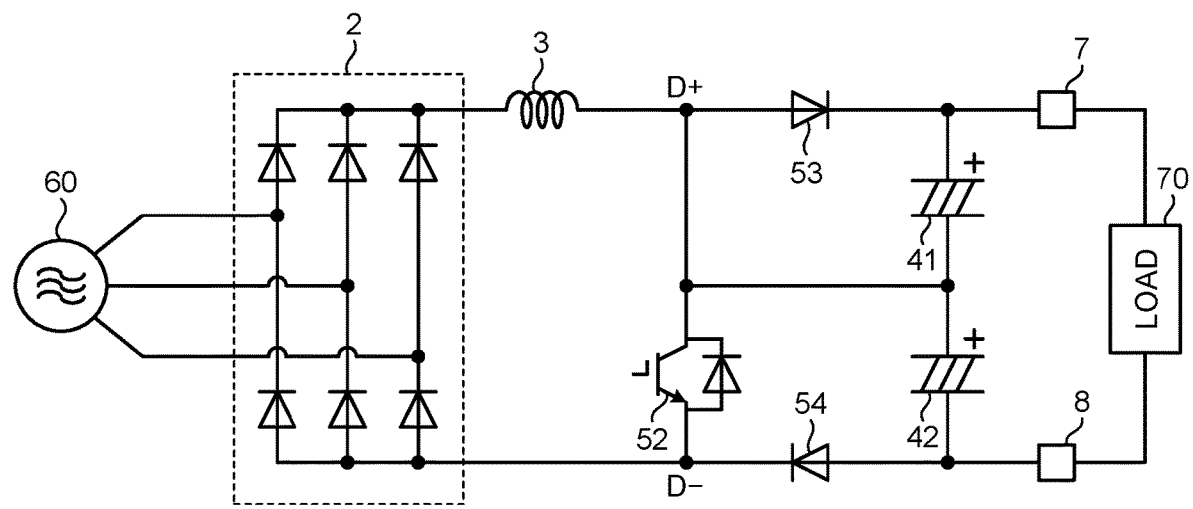
FIG. 17 is a schematic diagram of a circuit when the positive-side switching element and the negative-side switching element in FIG. 16 are short-circuited via the heat sink.

FIG. 16 is a circuit diagram of a direct current power supply device 1A according to the second embodiment in a case where the positive-side backflow prevention diode 53 and the negative-side backflow prevention diode 54 included in the charger 5A of the direct current power supply device 1A are the full mold package elements, and the positive-side switching element 51 and the negative-side switching element 52 included in the charger 5A are the elements that are not full mold packages. FIG. 17 is a schematic diagram of a circuit when the positive-side switching element 51 and the negative-side switching element 52 in FIG. 16 are short-circuited via the heat sink 10.

The direct current power supply device 1A includes the positive-side backflow prevention diode 53 and the negative-side backflow prevention diode 54 that are the full mold package elements. Thus, in the direct current power supply device 1A, the contact D+ and the contact D− are not electrically connected, and an excessive current does not flow for a relatively long time even at the time of power-on.

In the second embodiment, the positive-side backflow prevention diode 53 and the negative-side backflow prevention diode 54 are the full mold package elements. Thus, the direct current power supply device 1A according to the second embodiment can prevent the charges stored in the positive-side capacitor 41 and the negative-side capacitor 42 from flowing back, and can prevent a short circuit at both ends of the positive-side capacitor 41 and the negative-side capacitor 42 even if the positive-side switching element 51 and the negative-side switching element 52 are turned on after the positive-side capacitor 41 and the negative-side capacitor 42 are charged.

Therefore, the direct current power supply device 1A according to the second embodiment can prevent the occurrence of a short circuit at the time of power-on and prevent a short circuit at both ends of the positive-side capacitor 41 and the negative-side capacitor 42 while reducing the use of the full mold package element having a relatively high cost, and can also prevent breakdown of the element and heat loss of the circuit while being relatively inexpensive.

Third Embodiment

Figure 18:
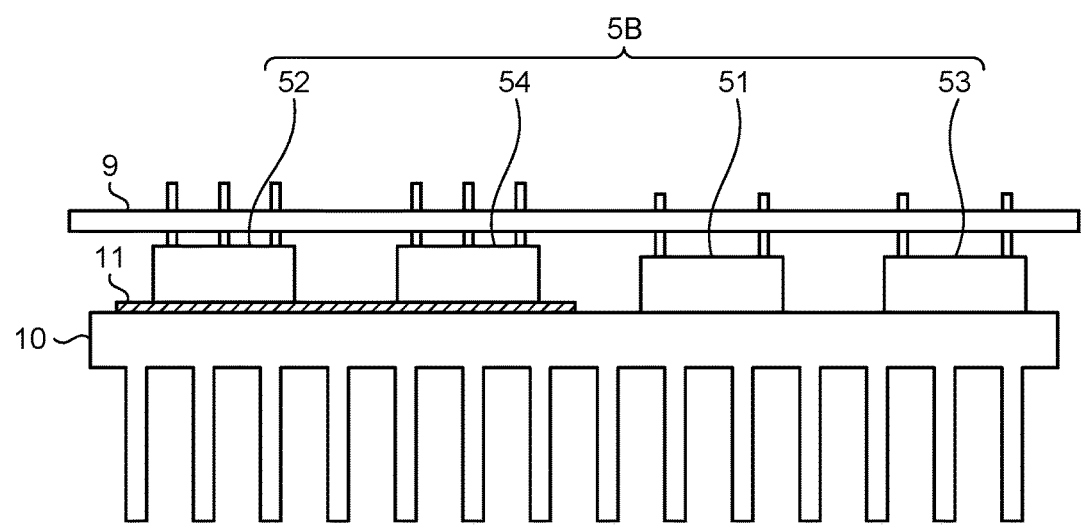
FIG. 18 is a first diagram illustrating a configuration of a charger included in a direct current power supply device according to a third embodiment.
Figure 19:
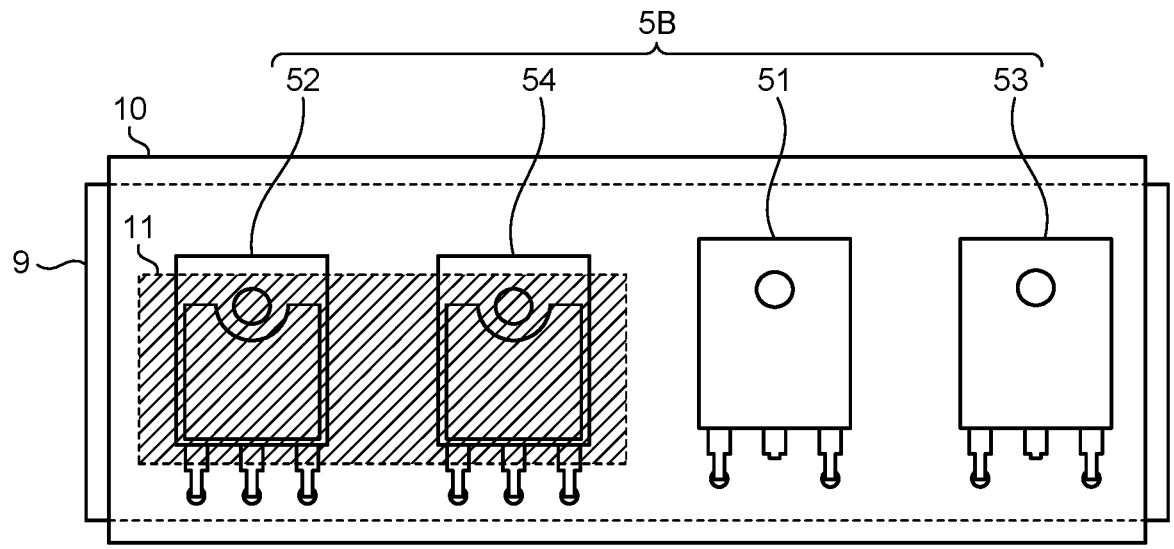
FIG. 19 is a second diagram illustrating a configuration of the charger included in the direct current power supply device according to the third embodiment.
Figure 20:
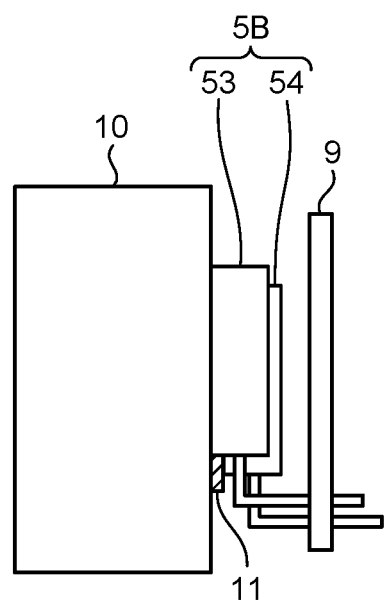
FIG. 20 is a third diagram illustrating a configuration of the charger included in the direct current power supply device according to the third embodiment.

FIG. 18 is a first diagram illustrating a configuration of a charger 5B included in a direct current power supply device according to a third embodiment. FIG. 19 is a second diagram illustrating a configuration of the charger 5B included in the direct current power supply device according to the third embodiment. FIG. 20 is a third diagram illustrating a configuration of the charger 5B included in the direct current power supply device according to the third embodiment. FIG. 18 schematically illustrates a plane surface of the charger 5B, FIG. 19 schematically illustrates a front surface of the charger 5B, and FIG. 20 schematically illustrates a side surface of the charger 5B. The direct current power supply device according to the third embodiment is a device in which the charger 5 included in the direct current power supply device 1 according to the first embodiment is replaced with the charger 5B. The third embodiment mainly describes differences from the first embodiment.

In the third embodiment, among the positive-side switching element 51, the negative-side switching element 52, the positive-side backflow prevention diode 53, and the negative-side backflow prevention diode 54 included in the charger 5B, the positive-side switching element 51 and the positive-side backflow prevention diode 53 are full mold package elements. The negative-side switching element 52 and the negative-side backflow prevention diode 54 are elements that are not full mold packages. In the third embodiment, the insulating sheet 11 is positioned between the heat sink 10 and each of the negative-side switching element 52 and the negative-side backflow prevention diode 54, thereby electrically insulating the negative-side switching element 52 and the negative-side backflow prevention diode 54.

Figure 21:
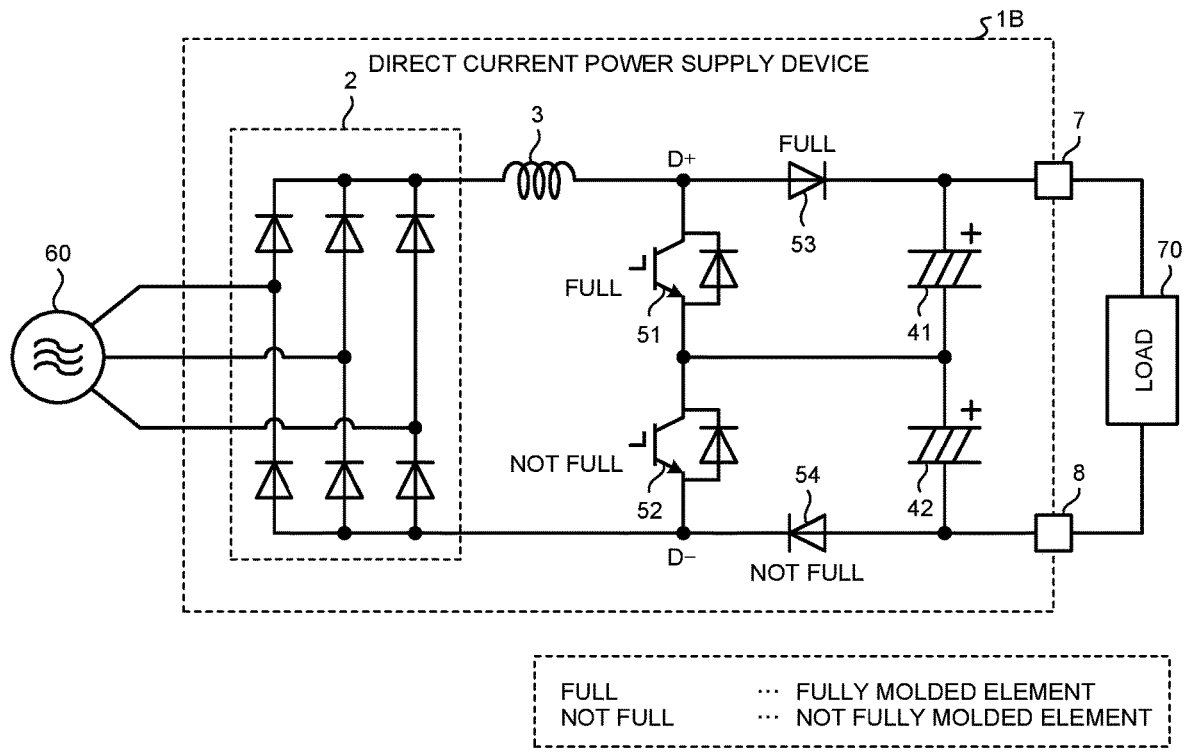
FIG. 21 is a circuit diagram of the direct current power supply device according to the third embodiment in a case where the positive-side switching element and the positive-side backflow prevention diode included in the charger of the direct current power supply device are full mold package elements, and the negative-side switching element and the negative-side backflow prevention diode included in the charger are elements that are not full mold packages.
Figure 22:
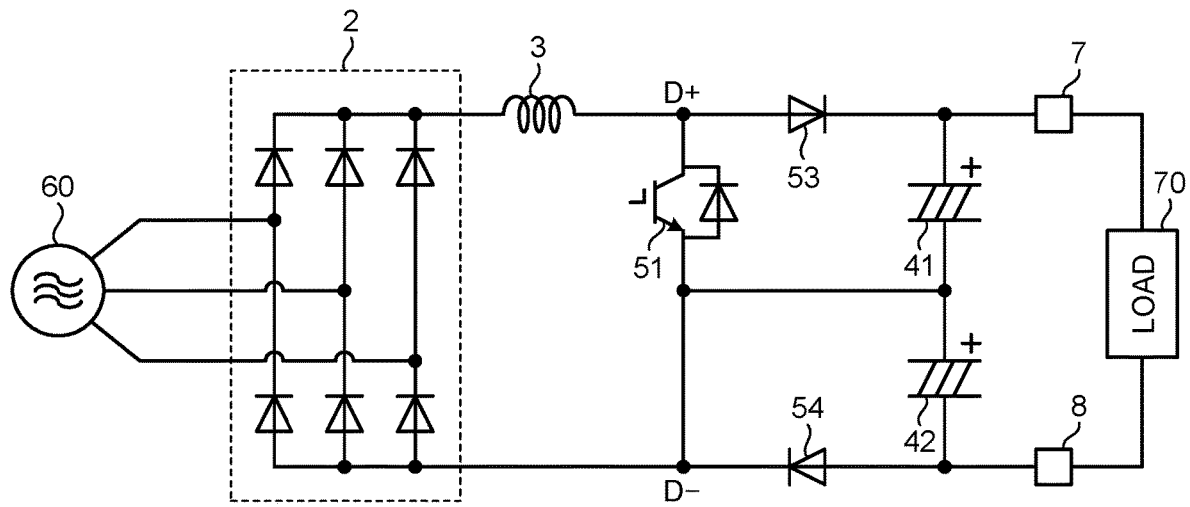
FIG. 22 is a schematic diagram of a circuit when the negative-side switching element and the negative-side backflow prevention diode in FIG. 21 are short-circuited via the heat sink.

FIG. 21 is a circuit diagram of a direct current power supply device 1B according to the third embodiment in a case where the positive-side switching element 51 and the positive-side backflow prevention diode 53 included in the charger 5B of the direct current power supply device 1B are the full mold package elements, and the negative-side switching element 52 and the negative-side backflow prevention diode 54 included in the charger 5B are the elements that are not full mold packages. FIG. 22 is a schematic diagram of a circuit when the negative-side switching element 52 and the negative-side backflow prevention diode 54 in FIG. 21 are short-circuited via the heat sink 10.

The direct current power supply device 1B includes the positive-side switching element 51 and the positive-side backflow prevention diode 53 that are the full mold package elements. Thus, in the direct current power supply device 1B, the contact D+ and the contact D− are not electrically connected, and an excessive current does not flow for a relatively long time even at the time of power-on.

In the third embodiment, the positive-side switching element 51 and the positive-side backflow prevention diode 53 are the full mold package elements. Thus, the direct current power supply device 1B according to the third embodiment can prevent the charges stored in the positive-side capacitor 41 and the negative-side capacitor 42 from flowing back, and can prevent a short circuit at both ends of the positive-side capacitor 41 and the negative-side capacitor 42 even if the positive-side switching element 51 and the negative-side switching element 52 are turned on after the positive-side capacitor 41 and the negative-side capacitor 42 are charged.

Therefore, the direct current power supply device 1B according to the third embodiment can prevent the occurrence of a short circuit at the time of power-on and a short circuit at both ends of the positive-side capacitor 41 and the negative-side capacitor 42 while reducing the use of the full mold package element having a relatively high cost, and can also prevent breakdown of the element and heat loss of the circuit while being relatively inexpensive.

Fourth Embodiment

Figure 23:
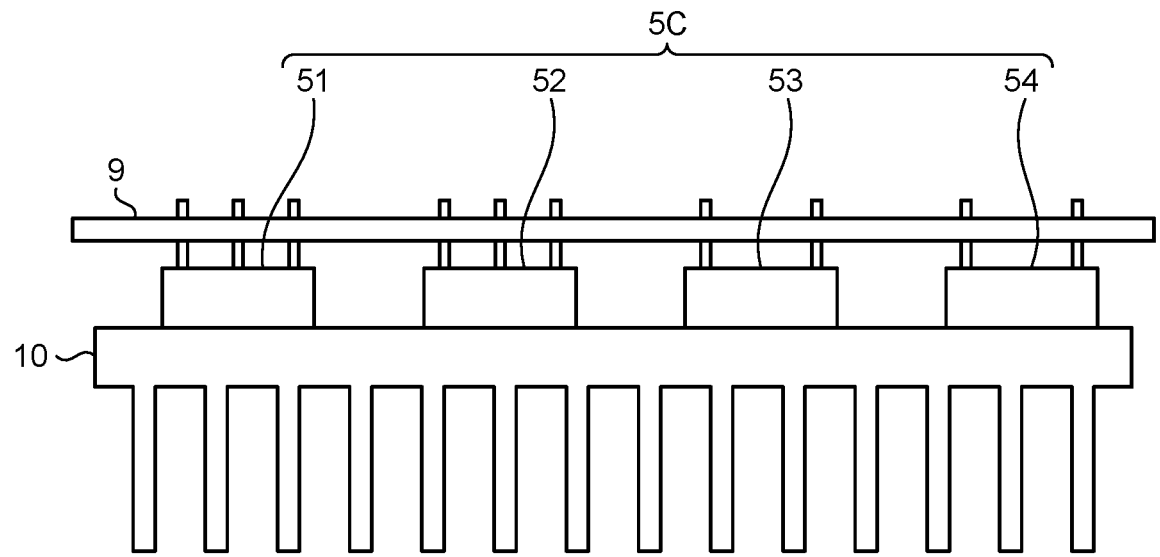
FIG. 23 is a first diagram illustrating a configuration of a charger included in a direct current power supply device according to a fourth embodiment.
Figure 24:
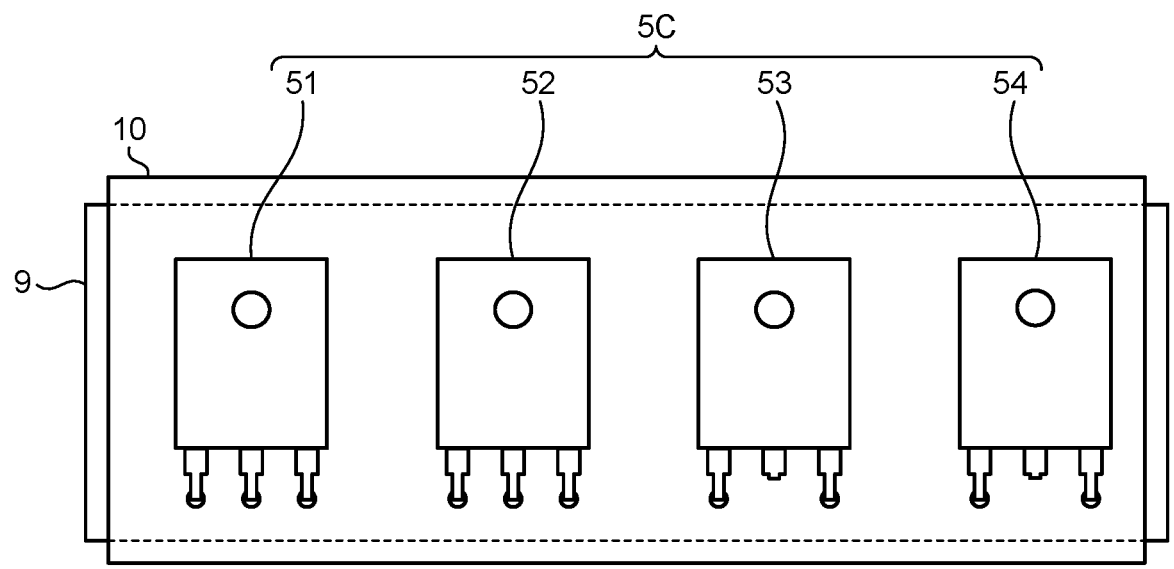
FIG. 24 is a second diagram illustrating a configuration of the charger included in the direct current power supply device according to the fourth embodiment.
Figure 25:
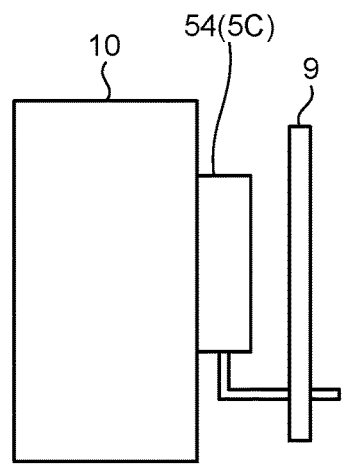
FIG. 25 is a third diagram illustrating a configuration of the charger included in the direct current power supply device according to the fourth embodiment.

FIG. 23 is a first diagram illustrating a configuration of a charger 5C included in a direct current power supply device according to a fourth embodiment. FIG. 24 is a second diagram illustrating a configuration of the charger 5C included in the direct current power supply device according to the fourth embodiment. FIG. 25 is a third diagram illustrating a configuration of the charger 5C included in the direct current power supply device according to the fourth embodiment. FIG. 23 schematically illustrates a plane surface of the charger 5C, FIG. 24 schematically illustrates a front surface of the charger 5C, and FIG. 25 schematically illustrates a side surface of the charger 5C. The direct current power supply device according to the fourth embodiment is a device in which the charger 5 included in the direct current power supply device 1 according to the first embodiment is replaced with the charger 5C. The fourth embodiment mainly describes differences from the first embodiment.

Figure 26:
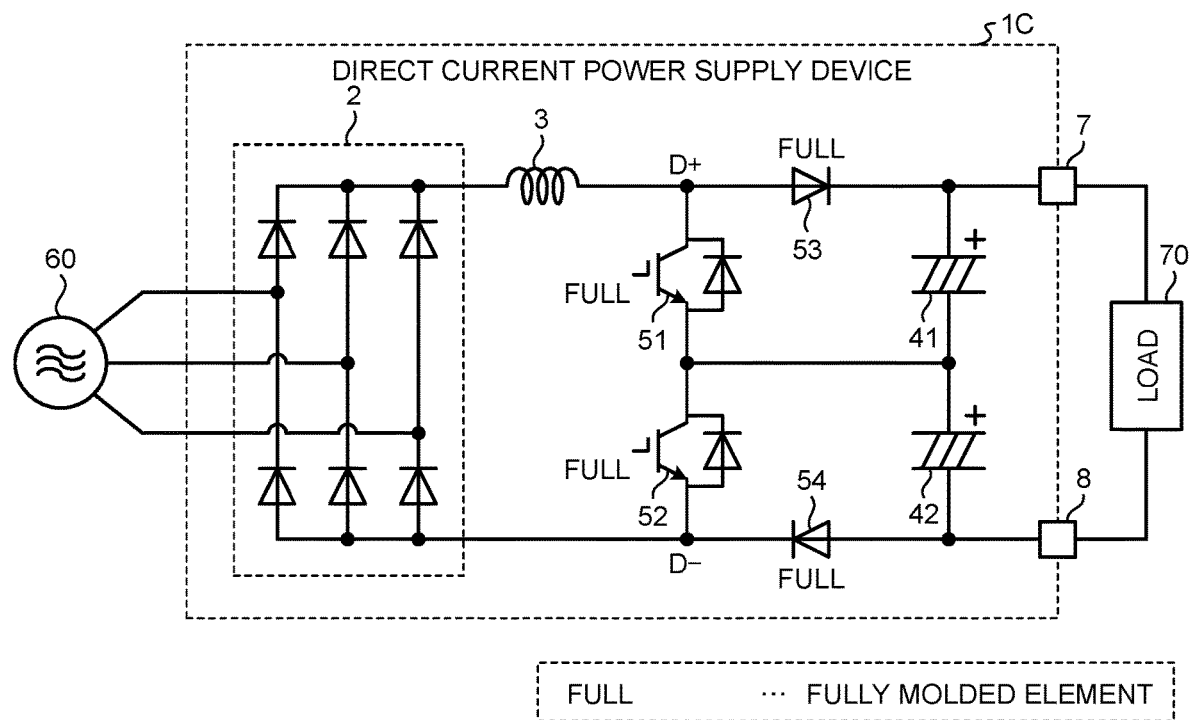
FIG. 26 is a circuit diagram of the direct current power supply device according to the fourth embodiment in a case where the positive-side switching element, the negative-side switching element, the positive-side backflow prevention diode, and the negative-side backflow prevention diode included in the charger of the direct current power supply device are full mold package elements.

In the fourth embodiment, the positive-side switching element 51, the negative-side switching element 52, the positive-side backflow prevention diode 53, and the negative-side backflow prevention diode 54 included in the charger 5C are full mold package elements. The direct current power supply device according to the fourth embodiment does not include the insulating sheet 11. FIG. 26 is a circuit diagram of a direct current power supply device 1C according to the fourth embodiment in a case where the positive-side switching element 51, the negative-side switching element 52, the positive-side backflow prevention diode 53, and the negative-side backflow prevention diode 54 included in the charger 5C of the direct current power supply device 1C are the full mold package elements.

The direct current power supply device 1C according to the fourth embodiment includes the positive-side switching element 51, the negative-side switching element 52, the positive-side backflow prevention diode 53, and the negative-side backflow prevention diode 54 that are the full mold package elements. As a result, the contact D+ and the contact D− are not electrically connected, and an excessive current does not flow for a relatively long time even at the time of power-on.

In the fourth embodiment, the positive-side switching element 51, the negative-side switching element 52, the positive-side backflow prevention diode 53, and the negative-side backflow prevention diode 54 are the full mold package elements. Thus, the direct current power supply device 1C according to the fourth embodiment can prevent the charges stored in the positive-side capacitor 41 and the negative-side capacitor 42 from flowing back, and can prevent a short circuit at both ends of the positive-side capacitor 41 and the negative-side capacitor 42 even if the positive-side switching element 51 and the negative-side switching element 52 are turned on after the positive-side capacitor 41 and the negative-side capacitor 42 are charged. Therefore, the direct current power supply device 1C can prevent the occurrence of a short circuit at the time of power-on, and can prevent a short circuit at both ends of the positive-side capacitor 41 and the negative-side capacitor 42.

In addition, since the positive-side switching element 51, the negative-side switching element 52, the positive-side backflow prevention diode 53, and the negative-side backflow prevention diode 54 are the full mold package elements, the fourth embodiment can obtain an effect that the charger 5C has low overall thermal resistance and better heat dissipation compared to a case where an element that is not a full mold package is attached to the heat sink 10 via the insulating sheet 11.

Figure 27:
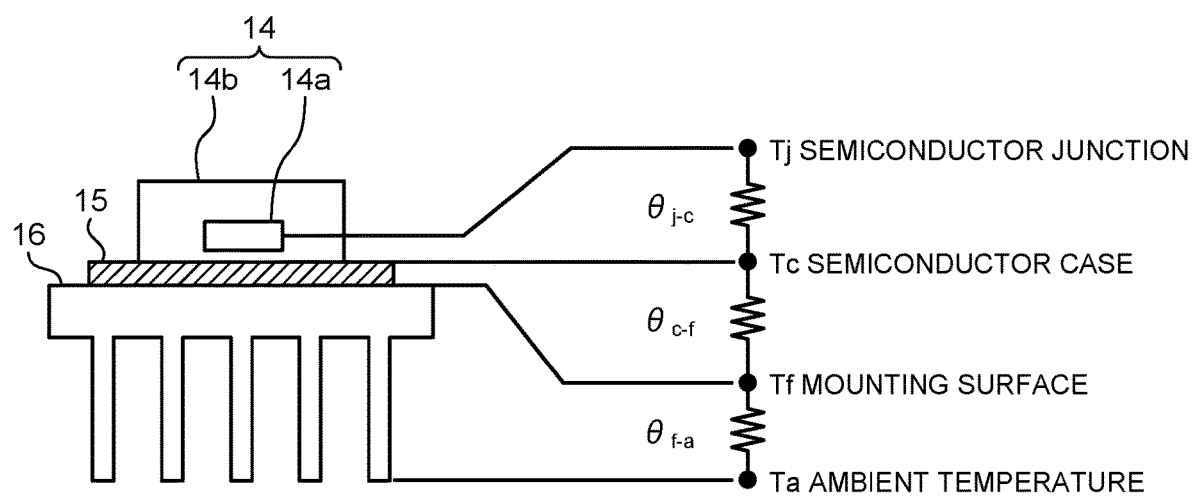
FIG. 27 is a diagram for explaining heat dissipation of a discrete semiconductor element.

The heat dissipation of the positive-side switching element 51, the negative-side switching element 52, the positive-side backflow prevention diode 53, and the negative-side backflow prevention diode 54 in the first to fourth embodiments will be described with reference to FIG. 27. The positive-side switching element 51, the negative-side switching element 52, the positive-side backflow prevention diode 53, and the negative-side backflow prevention diode 54 are discrete semiconductor elements. FIG. 27 is a diagram for explaining the heat dissipation of a discrete semiconductor element 14.

In FIG. 27, the discrete semiconductor element 14 is attached to a heat sink 16 via a heat dissipation member 15. The discrete semiconductor element 14 includes a chip 14a and a package 14b. The heat dissipation member 15 is, for example, an insulating sheet when the discrete semiconductor element 14 is an element that is not a full mold package. When the discrete semiconductor element 14 is a full mold package, for example, the heat dissipation member 15 is a member formed of silicone grease.

The thermal resistance of the heat dissipation member 15 is included in thermal resistance θc-f from a surface of the package 14b to a mounting surface of the heat sink 16. A semiconductor case Tc in FIG. 27 denotes the temperature of the surface of the package 14b, and a mounting surface Tf denotes the temperature of the mounting surface of the heat sink 16. In general, silicone grease has lower thermal resistance and better heat dissipation than the insulating sheet. Therefore, when the positive-side switching element 51, the negative-side switching element 52, the positive-side backflow prevention diode 53, and the negative-side backflow prevention diode 54 are full mold package elements, the manufacturer of the direct current power supply device can perform design to further improve the heat dissipation by selecting the heat dissipation member 15 with low thermal resistance. FIG. 27 illustrates a semiconductor junction Tj indicating the temperature of a semiconductor junction of the chip 14a, an ambient temperature Ta that is the temperature around the discrete semiconductor element 14, the heat dissipation member 15, and the heat sink 16, thermal resistance θj-c between the semiconductor junction Tj and the semiconductor case Tc, and thermal resistance θf-a between the mounting surface Tf and the ambient temperature Ta.

Fifth Embodiment

Figure 28:
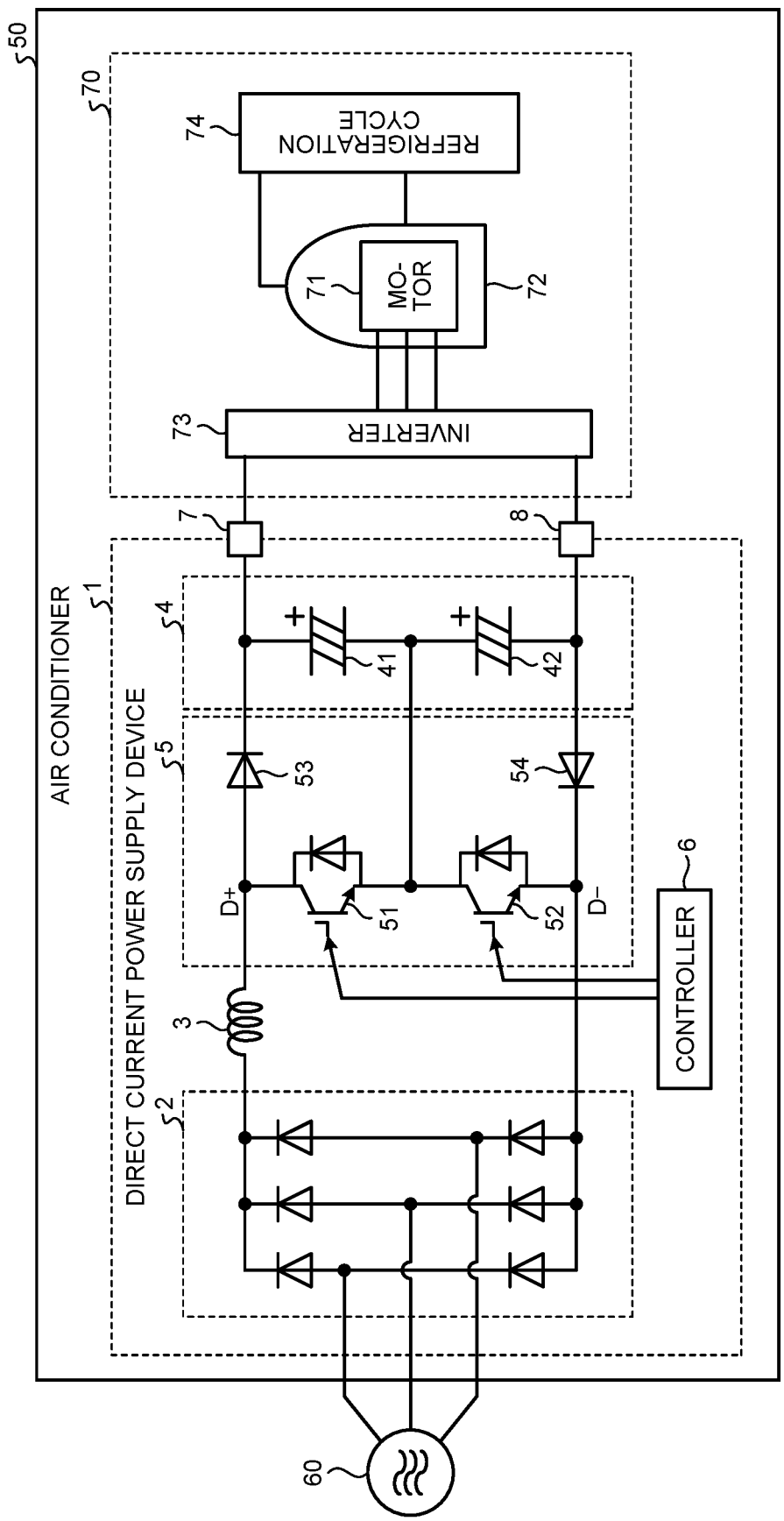
FIG. 28 is a diagram illustrating a configuration of an air conditioner according to a fifth embodiment.

FIG. 28 is a diagram illustrating a configuration of an air conditioner 50 according to a fifth embodiment. The air conditioner 50 includes the direct current power supply device 1 according to the first embodiment and the load 70. The load 70 includes a compressor 72 including a motor 71, an inverter 73 that drives the motor 71 on the basis of direct current power supplied from the direct current power supply device 1, and a refrigeration cycle 74. The air conditioner 50 includes the direct current power supply device 1, thereby being able to prevent the occurrence of a short circuit at the time of power-on and prevent breakdown of an element and heat loss of a circuit while being relatively inexpensive. Note that the direct current power supply device 1 may be replaced with the direct current power supply device 1A according to the second embodiment, the direct current power supply device 1B according to the third embodiment, or the direct current power supply device 1C according to the fourth embodiment.

Figure 29:
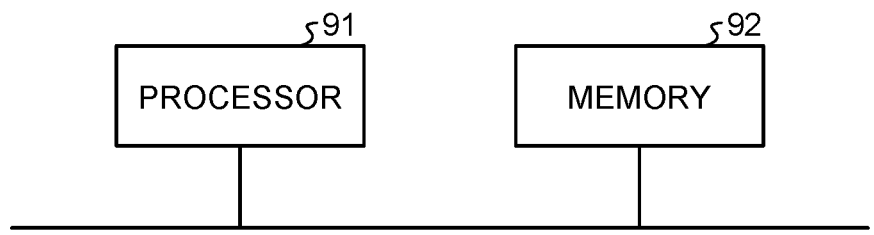
FIG. 29 is a diagram illustrating a processor in a case where some or all functions of a controller included in the direct current power supply device according to the first embodiment are implemented by the processor.

FIG. 29 is a diagram illustrating a processor 91 in a case where some or all functions of the controller 6 included in the direct current power supply device 1 according to the first embodiment are implemented by the processor 91. That is, some or all of the functions of the controller 6 may be implemented by the processor 91 that executes a program stored in a memory 92. The processor 91 is a central processing unit (CPU), a processing unit, an arithmetic unit, a microprocessor, or a digital signal processor (DSP). FIG. 29 also illustrates the memory 92.

In the case where some or all of the functions of the controller 6 are implemented by the processor 91, the some or all of the functions are implemented by the processor 91 and software, firmware, or a combination of software and firmware. The software or firmware is described as a program and stored in the memory 92. The processor 91 implements some or all of the functions of the controller 6 by reading and executing the program stored in the memory 92.

In the case where some or all of the functions of the controller 6 are implemented by the processor 91, the direct current power supply device 1 includes the memory 92 for storing a program that results in execution of some or all steps to be executed by the controller 6. In other words, the program stored in the memory 92 causes a computer to execute some or all procedures or methods to be executed by the controller 6.

The memory 92 includes, for example, a non-volatile or volatile semiconductor memory such as a random access memory (RAM), a read only memory (ROM), a flash memory, an erasable programmable read only memory (EPROM), or an electrically erasable programmable read only memory (EEPROM (registered trademark)); a magnetic disk; a flexible disk; an optical disk; a compact disc; a mini disc; a digital versatile disk (DVD); or the like.

Figure 30:
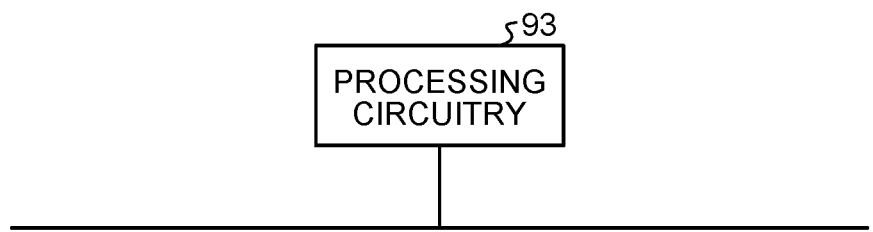
FIG. 30 is a diagram illustrating processing circuitry in a case where a part or the entirety of the controller included in the direct current power supply device according to the first embodiment is implemented by the processing circuitry.

FIG. 30 is a diagram illustrating processing circuitry 93 in a case where a part or the entirety of the controller 6 included in the direct current power supply device 1 according to the first embodiment is implemented by the processing circuitry 93. That is, a part or the entirety of the controller 6 may be implemented by the processing circuitry 93.

The processing circuitry 93 is dedicated hardware. The processing circuitry 93 is, for example, a single circuit, a complex circuit, a programmed processor, a parallel-programmed processor, an application specific integrated circuit (ASIC), a field programmable gate array (FPGA), or a combination thereof. A part of the controller 6 may be dedicated hardware separate from the rest.

Regarding the functions of the controller 6, some of the functions may be implemented by software or firmware, and the rest of the functions may be implemented by dedicated hardware. The functions of the controller 6 can thus be implemented by hardware, software, firmware, or a combination thereof.

The configuration illustrated in the above embodiment merely illustrates an example of the content of the present invention, and can thus be combined with another known technique and/or partially omitted or modified without departing from the gist of the present invention.

The invention claimed is:

1. A direct current power supply device that converts alternating current power supplied from an alternating current power supply into direct current power and supplies the direct current power to a load, the direct current power supply device comprising:
a rectifier circuit to rectify the alternating current power supplied from the alternating current power supply and convert the alternating current power into the direct current power;
a first output terminal and a second output terminal that are terminals for outputting the direct current power from the direct current power supply device to the load;
a charge storage device connected to the first output terminal and the second output terminal and including a function of storing a charge;
a charger to charge the charge storage device on the basis of the direct current power obtained by the rectifier circuit; and
a heat sink, wherein
the charge storage device includes a positive-side capacitor and a negative-side capacitor connected in series,
the charger includes a positive-side switching element, a negative-side switching element, a positive-side backflow prevention diode, and a negative-side backflow prevention diode for charging one or both of the positive-side capacitor and the negative-side capacitor,
the positive-side switching element, the negative-side switching element, the positive-side backflow prevention diode, and the negative-side backflow prevention diode are discrete semiconductor elements,
the heat sink includes a function of dissipating heat of the positive-side switching element, the negative-side switching element, the positive-side backflow prevention diode, and the negative-side backflow prevention diode,
the positive-side switching element, the negative-side switching element, the positive-side backflow prevention diode, and the negative-side backflow prevention diode are disposed on one or a plurality of planes of the heat sink,
the negative-side backflow prevention diode is a full mold package element, and
the positive-side switching element, the negative-side switching element, and the positive-side backflow prevention diode are elements that are not full mold packages.

2. The direct current power supply device according to claim 1,
further comprising an insulating sheet positioned between a plurality of the elements that are not full mold packages and the heat sink to electrically insulate each of the plurality of the elements that are not full mold packages.

3. The direct current power supply device according to claim 1,
wherein the positive-side switching element, the negative-side switching element, the positive-side backflow prevention diode, and the negative-side backflow prevention diode are thermally coupled to the heat sink.

4. An air conditioner comprising:
the direct current power supply device according to claim 1; and
the load,
wherein the load includes a compressor including a motor, and an inverter to drive the motor on the basis of direct current power supplied from the direct current power supply device.

5. A direct current power supply device that converts alternating current power supplied from an alternating current power supply into direct current power and supplies the direct current power to a load, the direct current power supply device comprising:
a rectifier circuit to rectify the alternating current power supplied from the alternating current power supply and convert the alternating current power into the direct current power;

a first output terminal and a second output terminal that are terminals for outputting the direct current power from the direct current power supply device to the load;

a charge storage device connected to the first output terminal and the second output terminal and including a function of storing a charge;

a charger to charge the charge storage device on the basis of the direct current power obtained by the rectifier circuit; and a heat sink, wherein the charge storage device includes a positive-side capacitor and a negative-side capacitor connected in series, the charger includes a positive-side switching element, a negative-side switching element, a positive-side backflow prevention diode, and a negative-side backflow prevention diode for charging one or both of the positive-side capacitor and the negative-side capacitor, the positive-side switching element, the negative-side switching element, the positive-side backflow prevention diode, and the negative-side backflow prevention diode are discrete semiconductor elements, the heat sink includes a function of dissipating heat of the positive-side switching element, the negative-side switching element, the positive-side backflow prevention diode, and the negative-side backflow prevention diode, the positive-side switching element, the negative-side switching element, the positive-side backflow prevention diode, and the negative-side backflow prevention diode are disposed on one or a plurality of planes of the heat sink, the positive-side backflow prevention diode and the negative-side backflow prevention diode are full mold package elements, and the positive-side switching element and the negative-side switching element are elements that are not full mold packages.

6. The direct current power supply device according to claim 5, further comprising an insulating sheet positioned between a plurality of the elements that are not full mold packages and the heat sink to electrically insulate each of the plurality of the elements that are not full mold packages.

7. The direct current power supply device according to claim 5, wherein the positive-side switching element, the negative-side switching element, the positive-side backflow prevention diode, and the negative-side backflow prevention diode are thermally coupled to the heat sink.

8. An air conditioner comprising:

the direct current power supply device according to claim 5; and the load, wherein the load includes a compressor including a motor, and an inverter to drive the motor on the basis of direct current power supplied from the direct current power supply device.

9. A direct current power supply device that converts alternating current power supplied from an alternating current power supply into direct current power and supplies the direct current power to a load, the direct current power supply device comprising:

a rectifier circuit to rectify the alternating current power supplied from the alternating current power supply and convert the alternating current power into the direct current power;

a first output terminal and a second output terminal that are terminals for outputting the direct current power from the direct current power supply device to the load;

a charge storage device connected to the first output terminal and the second output terminal and including a function of storing a charge;

a charger to charge the charge storage device on the basis of the direct current power obtained by the rectifier circuit; and a heat sink, wherein the charge storage device includes a positive-side capacitor and a negative-side capacitor connected in series, the charger includes a positive-side switching element, a negative-side switching element, a positive-side backflow prevention diode, and a negative-side backflow prevention diode for charging one or both of the positive-side capacitor and the negative-side capacitor, the positive-side switching element, the negative-side switching element, the positive-side backflow prevention diode, and the negative-side backflow prevention diode are discrete semiconductor elements, the heat sink includes a function of dissipating heat of the positive-side switching element, the negative-side switching element, the positive-side backflow prevention diode, and the negative-side backflow prevention diode, the positive-side switching element, the negative-side switching element, the positive-side backflow prevention diode, and the negative-side backflow prevention diode are disposed on one or a plurality of planes of the heat sink, the positive-side switching element and the positive-side backflow prevention diode are full mold package elements, and the negative-side switching element and the negative-side backflow prevention diode are elements that are not full mold packages.

10. The direct current power supply device according to claim 9, further comprising an insulating sheet positioned between a plurality of the elements that are not full mold packages and the heat sink to electrically insulate each of the plurality of the elements that are not full mold packages.

11. The direct current power supply device according to claim 9, wherein the positive-side switching element, the negative-side switching element, the positive-side backflow prevention diode, and the negative-side backflow prevention diode are thermally coupled to the heat sink.

12. An air conditioner comprising:

the direct current power supply device according to claim 9; and the load, wherein the load includes a compressor including a motor, and an inverter to drive the motor on the basis of direct current power supplied from the direct current power supply device.

13. A direct current power supply device that converts alternating current power supplied from an alternating current power supply into direct current power and supplies the direct current power to a load, the direct current power supply device comprising:

a rectifier circuit to rectify the alternating current power supplied from the alternating current power supply and convert the alternating current power into the direct current power;

a first output terminal and a second output terminal that are terminals for outputting the direct current power from the direct current power supply device to the load;

a charge storage device connected to the first output terminal and the second output terminal and including a function of storing a charge;

a charger to charge the charge storage device on the basis of the direct current power obtained by the rectifier circuit; and a heat sink, wherein the charge storage device includes a positive-side capacitor and a negative-side capacitor connected in series, the charger includes a positive-side switching element, a negative-side switching element, a positive-side backflow prevention diode, and a negative-side backflow prevention diode for charging one or both of the positive-side capacitor and the negative-side capacitor, the positive-side switching element, the negative-side switching element, the positive-side backflow prevention diode, and the negative-side backflow prevention diode are discrete semiconductor elements, the heat sink includes a function of dissipating heat of the positive-side switching element, the negative-side switching element, the positive-side backflow prevention diode, and the negative-side backflow prevention diode, the positive-side switching element, the negative-side switching element, the positive-side backflow prevention diode, and the negative-side backflow prevention diode are disposed on one or a plurality of planes of the heat sink, and the positive-side switching element, the negative-side switching element, the positive-side backflow prevention diode, and the negative-side backflow prevention diode are full mold package elements.

14. The direct current power supply device according to claim 13, wherein the positive-side switching element, the negative-side switching element, the positive-side backflow prevention diode, and the negative-side backflow prevention diode are thermally coupled to the heat sink.

15. An air conditioner comprising:

the direct current power supply device according to claim 13; and the load, wherein the load includes a compressor including a motor, and an inverter to drive the motor on the basis of direct current power supplied from the direct current power supply device.

* * * * *